United States Patent [19]

Lobermann et al.

[11] 4,192,174

[45] Mar. 11, 1980

[54] TRANSFORMER PROTECTIVE DEVICE

[75] Inventors: Claude Lobermann, Chaville; Jean-Claude Croitoriu, Viroslay, both of France

[73] Assignee: Automation 2000 S.A., Chaville, France

[21] Appl. No.: 839,888

[22] Filed: Oct. 6, 1977

[51] Int. Cl.² .............................................. H02H 7/04
[52] U.S. Cl. ......................................... 73/19; 73/308; 340/646; 361/37
[58] Field of Search ...................... 73/19, 308; 361/37, 361/38; 340/646, 522

[56] References Cited

U.S. PATENT DOCUMENTS

| | | | |
|---|---|---|---|
| 3,002,128 | 9/1961 | Eissmann | 361/37 |
| 3,114,478 | 12/1963 | Hilkemeier et al. | 73/308 X |
| 3,144,770 | 8/1964 | Sheely | 73/350 |
| 3,449,633 | 6/1969 | Fischer et al. | 361/37 |
| 3,680,359 | 8/1972 | Lynch | 73/28 X |
| 3,844,160 | 10/1974 | Yamaoka | 73/19 |
| 3,857,068 | 12/1974 | Braunstein | 361/37 |
| 4,001,644 | 1/1977 | Lingefelter et al. | 361/37 |

Primary Examiner—Daniel M. Yasich

Attorney, Agent, or Firm—LeBlanc, Nolan, Shur & Niles

[57] ABSTRACT

A housing, a first elongated generally cylindrical member fixed to the housing and having an open end which is adapted to be in open communication with the interior of the sealed transformer casing; this first member also has at least a portion of its length composed of transparent material for viewing the interior. Means, such as a float, are contained in the first cylindrical member for providing a visual indication of the gas emission levels. Additional means are coupled to and communicate with the first cylindrical member for measuring gas emission levels in the transformer and for measuring variations in the internal pressure of the transformer casing. A second generally cylindrical member is fixed to the housing and has one end adapted to extend into the sealed transformer casing. This second member includes means, such as temperature sensors, for detecting changes in the temperature of the dielectric in the transformer casing. Finally, means, such as thermostats and a thermometer, are fixed to the housing and coupled with the temperature sensing means for measuring the temperature changes and for providing a visual indication of the temperature changes.

9 Claims, 10 Drawing Figures

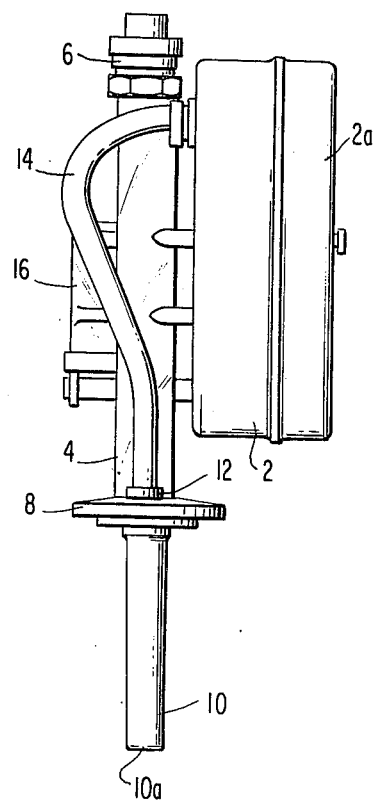
FIG.1A
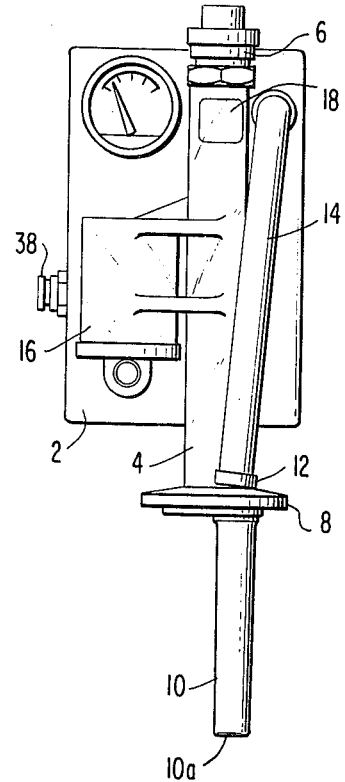
FIG.1B
FIG.2
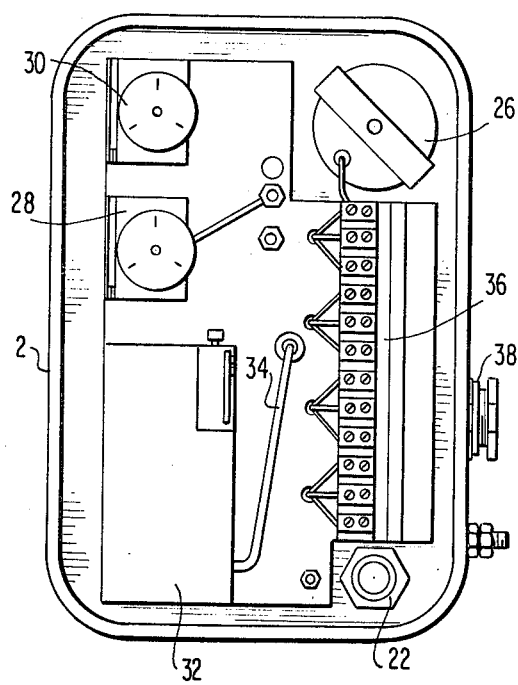
FIG.4
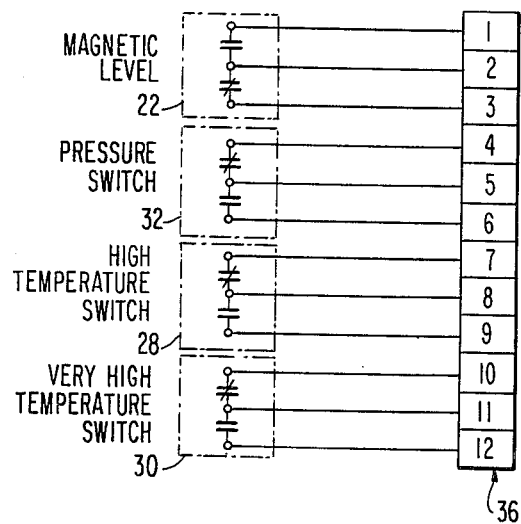

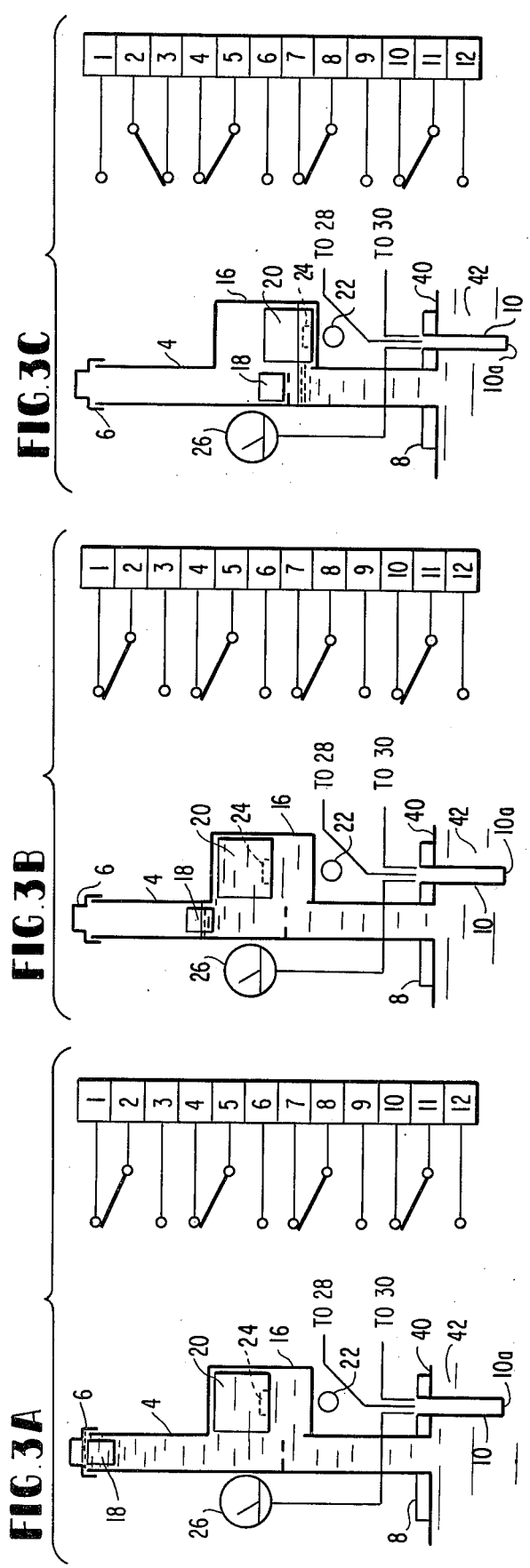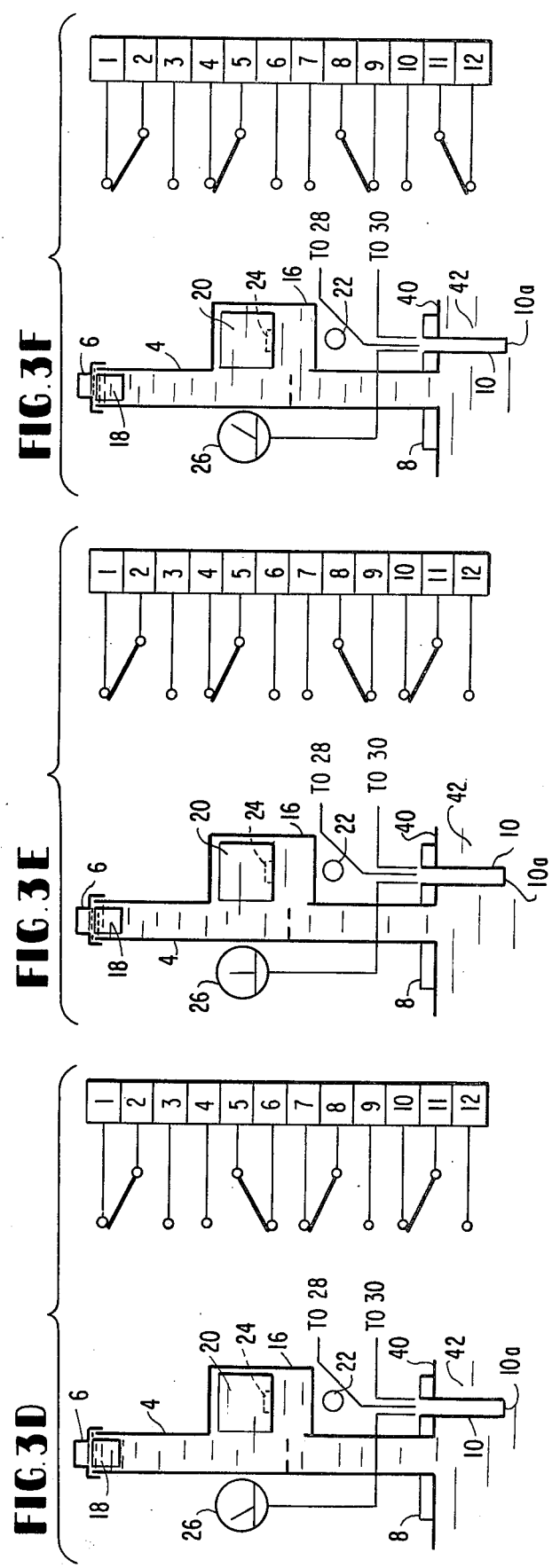

TRANSFORMER PROTECTIVE DEVICE

BACKGROUND OF THE INVENTION

This invention relates to protective devices for transformers. More particularly, the invention comprises an apparatus for monitoring the condition of a dielectric in a sealed transformer.

When a transformer is operating, the temperature of the windings increases to a greater or lesser extent depending upon the load. This causes the temperature of the dielectric cooling liquid to also increase; the volume of the dielectric thus increases with increasing temperature. When the transformer stops operating, the temperature of the windings and of the dielectric decrease and the volume of the dielectric liquid also decreases. This phenomena also exists when the load on a constantly operating transformer is varied, e.g. on a daily basis. Thus, for example, transformer load increases during the day when more energy is being used and decreases at night when less energy is being used.

In early transformers, an air space between the dielectric liquid and the transformer cover permitted expansion without the risk of overflow; in this manner, the transformer "breathed". This, however, permitted moisture in the ambient air to mix with the dielectric liquid, thereby reducing the dielectric strength of the liquid and enhancing oxidation and deterioration of the transformer winding insulation materials.

Various solutions to this problem have been attempted, one of which is the hermetically sealed transformer which does not "breathe". These transformers are generally filled with an oil or askarel (chlorinated liquid of specific density 1.6) dielectric.

A total fill sealed transformer is completely filled at around 20° C. and hermetically sealed so that no air comes in contact with the dielectric liquid. Since the transformer no longer breathes, as the dielectric liquid expands in volume and concurrently increases in temperature (under increased load conditions), an overpressure builds up in the transformer case. Excessive overpressure and/or excessive temperature increases can result in transformer breakdown. In addition, internal incidents in the transformer case may result in gas being released due to the decomposition of the insulators; this results in decreased dielectric levels and the potential risk of flashover between the high voltage connections at the transformer bushings in the case.

It is an object of the present invention to provide a protective device for use with sealed transformers.

It is a further object to provide a protective device which continuously monitors the condition of the dielectric in a sealed transformer.

It is a further object to provide a protective device which permits both visual and electronic monitoring of dielectric conditions.

It is a further object to provide a protective device to enable the transformer dielectric conditions to be monitored from a remote station.

SUMMARY OF THE INVENTION

This invention relates to an apparatus for measuring conditions in a sealed liquid dielectric filled transformer. The apparatus broadly comprises a housing, and a first generally cylindrical shaped member fixed to the housing and having an open end which is adapted to be in open communication with the interior of the sealed transformer casing; this first member also has at least a portion of its length composed of transparent material for viewing the interior. Means, such as a float, are contained in the first tubular member for providing a visual indication of the gas emission levels. Additional means are coupled to and communicate with the first cylindrical member for measuring gas emission levels in the transformer and for measuring variations in the internal pressure of the transformer casing. A second generally cylindrical member is fixed to the housing and has one end adapted to extend into the sealed transformer casing. This second member includes means, such as temperature sensors, for detecting changes in the temperature of the dielectric in the transformer casing. Finally, means, such as thermostats and a thermometer, are fixed to the housing and coupled with the temperature sensing means for measuring the temperature changes and for providing a visual indication of the temperature changes.

BRIEF DESCRIPTION OF THE DRAWINGS

FIG. 1A is a side elevation of the protective device;
FIG. 1B is a front plan view of the protective device;
FIG. 2 shows the interior of the protective device case;
FIGS. 3A–F show various operating stages of the protective device; and
FIG. 4 is a schematic wiring diagram.

DESCRIPTION OF THE PREFERRED EMBODIMENT

The transformer protective system of this invention comprises a housing or case 2, preferably metal, which houses portions of the apparatus as will be described below. The rear portion 2a is removable for access to the inside. Securely mounted to the outside of the case 2 is an elongated hollow transparent cylinder 4 which is closed at the top by a filling cap 6. The cylinder 4 is mounted to the case 2 in any known and convenient manner, e.g. by straps and/or brackets (not shown in specific detail).

The other end of elongated cylinder 4 (opposite the end closed by cap 6) is open; a plate or flange 8 is fitted around the open end of cylinder 4. Fixed to the underside of plate 8 is a hollow metal probe 10 sealed at the bottom 10a. Probe 10 is advantageously constructed of thermoconductive metal. The upper side of the flange 8 contains a fitting 12 to which one end of a flexible (metal, rubber, plastic, etc.) hose 14 is connected. The other end of hose 14 is connected to the case 2. In an alternative embodiment, probe 10 and hose 14 may comprise a single relatively rigid tube.

A second transparent cylinder 16, substantially shorter than cylinder 4, is also mounted to the exterior of case 2. The interiors of cylinder 4 and cylinder 16 are in open communication.

A buoyant member or float 18 (first indicating means), painted a highly visible color (e.g. red) is contained in cylinder 4 and is freely movable axially therein. The inside of cylinder 4 may be provided with stops to limit the downward axial movement of float 18. A similar buoyant member or float 20 is contained in short cylinder 16. (Floats 18 and 20 comprise the first indicating means.)

Located immediately under the bottom of cylinder 16 is a switch 22 which is actuated by float 20. Specifically, switch 22 may advantageously comprise a single pole double throw magnetic reed switch. Float 20 contains a small magnet (such as a ticonal 600 bar magnet) 24. Finally, the case 2 mounts the face of a thermometer 26 (second indicating means), advantageously having a temperature range of 0° C. to 120° C.

The inside of case 2 houses a pair of (e.g., Sopac S.T.F.) thermostats 28, 30 (second detecting means), which are adjustable over a range of 30° C. to 120° C. The sensors for the two thermostats and for the thermometer are contained in the probe 10 and are connected by electrical leads (shown schematically in FIGS. 3A–3F) to the respective devices through the flexible conduit 14. Preferably thermostats 28, 30 are preset to trigger at different temperatures, to thereby monitor moderate and severe temperature increases in the transformer dielectric. A (e.g., Georgin Pace 6J10) pressure switch mechanism 32 (first detecting means), adjustable between 100 and 500 millibars is also housed in casing 2. The pressure switch 32 may be readily modified to measure up to about 2.0 bars (max) of pressure. A hollow tube 34 connects the pressure switch 32 with the interior of cylinder 4 or cylinder 16. Finally, an electrical terminal block 36 is mounted in casing 2. A cable gland 38 provides the opening in case 2 for connecting a multiconductor cable to the terminal block 36 to thereby enable the protective device to be connected to remote indicators and/or recorders. The electrical circuit including the thermostatic switches 28, 30, pressure switch 32, and magnetic switch 22 is shown schematically in FIG. 4.

The protective device of the invention is mounted to the top of a sealed transformer 40. Preferably, the transformer 40 is filled nearly full with a dielectric (e.g. oil or an askarel) 42 in the usual manner. Prior to sealing the transformer, the protective device of the invention is fitted over the open top of the transformer so that the probe 10 extends into the transformer dielectric. Plate or flange 8 forms a seal over the transformer opening. Thereafter, the filling is completed through elongated cylinder 4, after which filling cap 6 is tightly secured to the upper end of the cylinder 4.

In a transformer with a liquid dielectric, an internal incident, such as an excessive current surge causing overheating of the transformer winding, creates a release of gas due to a decomposition of the (liquid or solid) insulators under the action of heat and/or electric arc. Production of this gas results in a decrease in the dielectric level. Other factors may also result in a lowering of the dielectric level, such as, an excessive pressure increase in the transformer case, and/or an excessive temperature rise in the transformer dielectric.

The protective device of this invention is designed to detect all of these aberrations to permit corrective action to be taken before a total breakdown of the transformer occurs. Detection of gas emission or any other action which results in a lowering of the dielectric liquid level, is accomplished in two phases:

(1) A visual indication is provided by means of the brightly colored float 18. As the dielectric liquid level in column 4 decreases, due, for example, to gas emission in the transformer, the float moves visibly downwardly in the transparent cylinder 4. (FIG. 3B).

(2) When an excessive amount of gas is produced or other action occurs which results in a critical decrease in the dielectric level, float 20 falls to the bottom of cylinder 16 where it makes magnetic contact with reed switch 22. (FIG. 3C). When reed switch 22 closes, an electrical circuit is completed to trigger an alarm or other indication which may be transmitted by cable to a remote watch station.

When the transformer is operative, the temperature of the windings increases as a function of the load on the transformer. This causes the temperature and the volume of the dielectric liquid to increase simultaneously. These temperature and pressure increases in the dielectric liquid are also detected by this invention.

An internal overpressure condition is detected by the pressure switch 32 located in case 2. When an overpressure condition is detected, the pressure switch is activated to complete an electrical circuit which triggers an alarm or other remote indication (FIG. 3D).

The temperature of the dielectric liquid is continuously monitored by the thermometer 26 and excessive temperature increases are detected by thermostats 28 and 30. A first stage temperature increase causes thermostat 28 to close an electrical circuit to trigger a first warning (FIG. 3E); if the temperature continues to rise, a second stage warning is triggered by thermostat 30 (FIG. 3F).

It will be seen that the protective device of this invention advantageously permits a number of transformer conditions to be simultaneously monitored from a remote location. This, of course, allows efficient monitoring of a plurality of transformers at the same time using a minimum of personnel.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced herein.

What is claimed and desired to be secured by U.S. Letters Patent is:

1. Apparatus for measuring conditions in a liquid dielectric filled transformer, comprising: a housing;
    generally elongated cylindrical means fixed to said housing and having one closed end and a second end which is adapted to be in open communication with dielectric liquid in the interior of the transformer casing;
    a member fixed to said housing and having one end adapted to extend into the transformer casing;
    first indicating means contained in said generally cylindrical means for measuring gas emission levels in the transformer casing and for providing an indication of said gas emission levels;
    first detecting means coupled with said generally cylindrical means for detecting predetermined variations in the internal pressure of said transformer casing;
    second detecting means coupled with said member extending into the transformer casing for detecting changes in the temperature of the dielectric in said transformer casing; and
    second indicating means fixed to said housing and coupled with said second detecting means for providing a visual indication of said temperature changes.

2. Apparatus for measuring conditions in a liquid dielectric filled transformer, comprising: a housing;
    generally elongated cylindrical means fixed to said housing and having one closed end and a second end which is adapted to be in open communication with dielectric liquid in the interior of the transformed casing, said cylindrical means being at least partially composed of transparent material for viewing the interior thereof;

a member fixed to said housing and having one end adapted to extend into the transformer casing; first indicating means contained in said generally cylindrical means for measuring gas emission levels in the transformer casing and for providing a visual indication of said gas emission levels;

first detecting means coupled with said generally cylindrical means for detecting predetermined variations in the internal pressure of said transformer casing; second detecting means coupled with said member extending into the transformer casing for detecting changes in the temperature of the dielectric in said transformer casing; and second indicating means fixed to said housing and coupled with said second detecting means for providing a visual indication of said temperature changes.

3. Apparatus according to claim 2, wherein, said first indicating means comprises a float axially movable within said cylindrical means.

4. Apparatus according to claim 3, wherein: said first indicating means comprises a further float and means actuated by said further float for closing an electric circuit when the measured gas emission level exceeds a predetermined value.

5. Apparatus according to claim 4, wherein: said means actuated by said further float comprise a pair of magnetic reed switch contacts; and said further float contains a magnet for closing said reed switch contacts when said magnet and switch contacts are in relatively close proximity.

6. Apparatus according to claim 2, wherein, said second detecting means comprises at least one thermostatically controlled switch means for closing an electrical circuit when the measured temperature of the dielectric exceeds a predetermined value.

7. The apparatus according to claim 6, wherein, said second detecting means comprises a second thermostatically controlled switch means for closing an electrical circuit when the measured temperature of the dielectric exceeds a second predetermined value higher than said first predetermined value.

8. Apparatus according to claim 2, wherein, said first detecting means comprises pressure operated switch means for closing an electrical circuit when the measured pressure of said dielectric exceeds a predetermined value.

9. Apparatus according to claim 1, wherein the interior of the portion of the member which extends into said transformer casing is sealed against open communication with the interior of the transformer casing.

* * * * *